United States Patent [19]

Sakagami

[11] Patent Number: 4,984,197
[45] Date of Patent: Jan. 8, 1991

[54] SEMICONDUCTOR MEMORY DEVICE HAVING TRANSFER GATES COUPLED BETWEEN BIT LINE PAIRS AND SENSE AMPLIFIER CIRCUITS

[75] Inventor: Takako Sakagami, Toyko, Japan
[73] Assignee: NEC Corporation, Tokyo, Japan
[21] Appl. No.: 442,760
[22] Filed: Nov. 29, 1989

[30] Foreign Application Priority Data

Nov. 30, 1988 [JP] Japan .................... 63-303608

[51] Int. Cl.[5] ............................ G11C 5/06
[52] U.S. Cl. .................... 365/63; 365/190; 357/45
[58] Field of Search ............ 365/63, 149, 190, 205, 365/208; 357/45

[56] References Cited
U.S. PATENT DOCUMENTS
4,689,770  8/1987  Miyamoto et al. .............. 365/149

Primary Examiner—James W. Moffitt
Attorney, Agent, or Firm—Sughrue, Mion, Zinn, Macpeak & Seas

[57] ABSTRACT

A semiconductor memory device of the type having a pair of transfer gates between a bit line pair and an interconnection pair coupled to a sense amplifier circuit operates at a high speed because of the reduction of parasitic capacitances coupled to the sense amplifier circuit, however, the sense amplifier circuit is so sensitive to an electrical unbalance between the input nodes thereof that a transfer signal line is coupled to the gate electrodes of the transfer gates through a contact window located in such a manner that coupling capacitances between the transfer signal line and the interconnections do not provide the electrical unbalance, then the contact window is by way of example located between the interconnections.

8 Claims, 7 Drawing Sheets

SEMICONDUCTOR MEMORY DEVICE HAVING TRANSFER GATES COUPLED BETWEEN BIT LINE PAIRS AND SENSE AMPLIFIER CIRCUITS

FIELD OF THE INVENTION

This invention relates to a semiconductor memory device and, more particularly, to a structure around transfer gates incorporated in the semiconductor memory device for selectively relaying and blocking a small differential voltage signal on each bit line pair.

DESCRIPTION OF THE RELATED ART

First, description is made for a circuit arrangement and a behavior of a semiconductor memory device of the type having transfer gates coupled between bit line pairs and associated sense amplifier circuits, and the present invention appertains to the semiconductor memory device.

A typical example of the semiconductor memory device is illustrated in FIG. 1 of the drawings, and largely comprises a plurality of memory cells MA11, MA12, MA13, MA21, MA22, MA23, MB11, MB12, MB13, MB21, MB22 and MB23 arranged in rows and columns, a plurality of sense amplifier circuits SA1, SA2 and SA3, and a controlling circuit CNT provided in association with the sense amplifier circuits SA1 to SA3. Although a large number of the memory cells are provided in the semiconductor memory device, only twelve memory cells are shown in FIG. 1. The memory cells MA11 to MB23 are of the one-transistor and one-capacitor type, and switching transistors QA11, QA12, QA13, QA21, QA22, QA23, QB11, QB12, QB13, QB21, QB22 and QB23 and storage capacitors CA11, CA12, CA13, CA21, CA22, CA23, CB11, CB12, CB13, CB21, CB22 and CB23 form in combination the twelve memory cells MA11 to MB23, respectively. The columns of the switching transistors QA11 to QA23 are respectively coupled to bit lines BA1, BA2 and BA3 which are respectively paired with bit lines BB1, BB2 and BB3 for formation of bit line pairs. The bit lines BB1, BB2 and BB3 are coupled to the columns of the switching transistors QB11 to QB23, and all of rows of the switching transistors QA11 to QA23 and QB11 to QB23 are coupled at the gate electrodes thereof to word lines WB1, WA1, WB2 and WA2. The semiconductor memory device shown in FIG. 1 further comprises dummy word lines DWB and DWA, and dummy storage capacitors DCA1, DCA2, DCA3, DCB1, DCB2 and DCB3 are coupled between the bit lines BA1 to BA3 and the dummy word line DWA and between the bit lines BB1 to BB3 and the dummy word line DWB, respectively. The dummy word lines are complimentarily shifted between high and low voltage levels for providing a reference voltage level to either bit line group BA1 to BA3 or BB1 to BB3, and data bits are read out from the memory cells coupled to the other bit line group BB1 to BB3 or BA1 to BA3.

The bit lines BA1 to BA3 and BB1 to BB3 are coupled to precharging transistors QP1, QP2, QP3, QP4, QP5 and QP6, respectively, and the precharging transistors QP1 to QP6 are gated by a precharging signal line PDL. Equalizing transistors QE1, QE2 and QE3 are coupled between the bit lines BA1 to BA3 and the respective paired bit lines BB1 to BB3, and are also gated by the precharging signal line PDL. When the precharging signal line PDL goes up to an active high voltage level, all of the precharging transistors QP1 to QP6 as well as the equalizing transistors QE1 to QE3 turn on, and currents are supplied from a source line HVC of positive high voltage level to the bit lines BA1 to BA3 and BB1 to BB3 which are equalized in voltage level through the respective equalizing transistors QE1 to QE3.

The bit lines BA1 to BA3 and BB1 to BB3 are further coupled at the other ends to transfer gates TA1 to TA3 and TB1 to TB3, respectively, and a transfer signal line TG simultaneously supplies a transfer signal to the gate electrodes of the transfer gates TA1 to TA3 and TB1 to TB3. The transfer gates TA1 to TA3 and TB1 to TB3 propagates differences in voltage level from the bit line pairs through nodes NA1, NA2, NA3, NB1, NB2 and NB3 to the sense amplifier circuits SA1 tc, SA3 or vice versa.

The sense amplifier circuits SA1 to SA3 are coupled in parallel between a high voltage line HVL and a low voltage line LVL, and are associated with the bit line pairs, respectively. The high voltage line HVL is coupled to a source of positive high voltage level through a switching transistor QS1 of the p-channel type filed effect transistor, and the low voltage line LVL is electrically connected to the ground voltage source through another switching transistor QS2. Since the switching transistor QS1 is accompanied with an inverter circuit INV, an activation signal SE simultaneously shifts the switching transistors QS1 and QS2 between on and off states.

Each of the sense amplifier circuit SA1, SA2 or SA3 comprises two series combinations of p-channel type filed effect transistors QSA1 and QSA2 and n-channel type field effect transistors QSA3 and QSA4 coupled in parallel between the high voltage line HVL and the low voltage line LVL. All of the sense amplifier circuits SA1 to SA3 are similar in circuit arrangement to one another, and, for this reason, description is continued for the sense amplifier circuit SA1 only. The series combination of the transistors QSA1 and QSA3 are gated by the node NB1, but the series combination of the transistors QSA2 and QSA4 are gated by the node NA1. The sense amplifier circuit SA1 thus coupled in a crossing manner is responsive to the small difference in voltage level under the activated state, and the difference in voltage level between the nodes NA1 and NB1 is increased through the difference amplification. The nodes NA1 and NB1 are coupled to a data line pair for reading out the data bit, however, the data line pair is not shown in FIG. 1 for the sake of simplicity.

Referring to FIG. 2 of the drawings, a reading out operation of the semiconductor memory device shown in FIG. 1 is completed through five time periods I, II, III, IV and V sequentially followed by one to another. Assuming now that the memory cell MA21 is accessed from the outside of the semiconductor device, the precharging signal line PDL and the transfer signal line TG go up to the positive high voltage level and remain high during the first time period I. The precharging transistors QP1 to QP6 and the equalizing transistors QE1 to QE3 turn on so as to charge up the bit lines BA1 to BA3 and BB1 to BB3 in the presence of the precharging signal of the active high voltage level, and the transfer gates TA1 to TA3 and TB1 to TB3 also turn on in the presence of the transfer signal of the active high voltage level for propagating the voltage levels on the bit lines to the nodes NA1 to NA3 and NB1 to NB3, respectively. Then, the voltage level is strictly balanced on the bit line pairs and, accordingly, between the nodes NA1 to NA3 and NB1 to NB3.

In the second time period II, the precharging signal line PDL is recovered to the low voltage level at time t10, but the transfer signal line TG is maintained in the positive high voltage level. The dummy word line DWB goes down to the low voltage level at time t11, and the bit lines BB1 to BB3 are slightly lowered to produce differences in voltage level between the bit lines BA1 to BA3 and the paired bit lines BB1 to BB3, respectively. Thus, a reference voltage level is produced on the bit lines BB1 to BB3 by virtue of the dummy capacitors DCB1 to DCB3. If the word line WA2 goes up to the positive high voltage level at time t12, the switching transistors QA21 to QA23 turn on for providing conduction paths between the associated storage capacitors CA21 to CA23 and the bit lines BA1 to BA3.

Since the memory cell MA21 is assumed to be accessed, description is hereinbelow focused upon the node pair NA1 and NB1. If the memory cell MA21 memorizes a data bit of logic "0" level and, accordingly, no electric charge is accumulated in the storage capacitor CA21, the bit line BA1 goes down to the low voltage level which is slightly lower than the reference voltage level as will be seen from FIG. 2, and the small difference in voltage level is transferred from the bit lines BA1 and BB1 to the nodes NA1 and NB1.

The reading out operation, then, proceeds to the third time period III, and the transfer signal line TG is recovered to the low voltage level. The transfer gates TA1 and TB1 turn off so as to cut off the nodes NA1 and NB1 from the bit lines BA1 and BB1. For this reason, the sense amplifier circuit SA1 is free from parasitic capacitances coupled to the bit lines BA1 and BB1, and drives small amounts of parasitic capacitances each of the order of a hundred fF coupled to the nodes NA1 and NB1. This results in an extremely high speed difference amplification.

The third time period III is completed at time t13, and the activating signal SE goes up to the positive high voltage level. The switching transistors QS1 and QS2 simultaneously turn on to activate the sense amplifier circuit SA1, and the sense amplifier circuit carries out the difference amplification so that the small difference between the nodes NA1 and NB1 is increased in the fourth time period IV.

The transfer signal line TG goes up to the positive high voltage level at time t14 again, and the transfer gates TA1 to TA3 and TB1 to TB3 turn on again to provide the respective conduction paths between the bit line pairs and the sense amplifier circuits SA1 to SA3. Then, the increased differences in voltage level are transferred to the original memory cells MA21 to MA23 through the bit line pairs, respectively, and the data bits originally memorized therein are refreshed in the fifth time period V.

The semiconductor memory device thus arranged is advantageous in the operation speed by virtue of the transfer gates TA1 to TA3 and TB1 to TB3. However, the transfer gates TA1 to TA3 and TB1 to TB3 are causative of another trouble encountered in the prior art semiconductor memory device. This trouble is derived from the structure around the transfer gates TA1 to TA3 and TB1 to TB3, and description is made for the structure around the transfer gates In detail, the three-dimensional layout around the transfer gates TA1 to TA3 and TB1 to TB3 is illustrated in FIG. 3 of the drawings, however, a passivation film is stripped off so as to expose an aluminum strip. Reference numeral 31 designates a p-type semiconductor substrate, and n-type impurity regions 32, 32', 33, 33', 34, 34', 35, 35' 36, 36', 37 and 37' are formed in the semiconductor substrate 31. The semiconductor substrate 31 is covered with a lower level insulating film 38, and a polysilicon strip PS is formed on the lower level insulating film 38. The polysilicon strip PS has three branch portions, and the branch portions provide gate electrodes of the transfer gates TA1 to TA3, respectively, but the trunk portion of the polysilicon strip PS serves as gate electrodes of the transfer gates TB1 to TB3. The polysilicon strip PS is covered with an inter-level insulating film 39, and refractory metal silicide strips RS1, RS2, RS3, RS4, RS5 and RS6 extend in parallel over the inter-level insulating film 39. The refractory metal silicide strips RS1, RS3 and RS5 partially serve as the nodes NA1 to NA3, respectively, and the refractory metal silicide strips RS2, RS4 and RS6 as the nodes NB1 to NB3. On the inter-level insulating film 39 are further formed refractory metal silicide films RS7, RS8, RS9, RS10, RS11 and RS12 which provide the bit lines BA1, BB1, BA2, BB2, BA3 and BB3, respectively. Contact windows CW1, CW2, CW3, CW4, CW5, CW6, CW7, CW8, CW9, CW10, CW11 and CW12 are formed in the inter-level insulating film 38, and the refractory metal silicide strips RS1 to RS6 pass through the contact windows CW1 to CW6 and reach the impurity regions 32 to 37, respectively. The refractory metal silicide films RS7 to RS12 respectively pass the contact windows CW7 to CW12 for contacting the other sides of the impurity regions 32 to 37, and the refractory metal silicide strips RS7 to RS12 are respectively conducted to the refractory metal silicide strips RS1 to RS6 in the presence of the transfer signal on the polysilicon strip PS.

These refractory metal silicide films RS1 to RS12 are overlain by an upper level insulating film 40, and an aluminum strip AL is fromed on the upper level insulating film 40. Since contact windows CW13 and CW14 are formed in the upper level insulating film 40, the aluminum strip AL is connected through the contact windows CW13 and CW14 to the branch portions of the polysilicon strip PS, respectively. In order to discriminate the contact windows CW13 and CW14 from the contact windows CW1 to CW12, the contact windows CW1 to CW12 are indicated by hatched lines, but each of the contact windows CW13 or CW14 is marked with an X in a square.

The semiconductor memory device thus arranged is of the multiple-level structure, and the conductive strips are complicated on the respective levels For example, the three-dimensional structure around the contact window CW14 is shown in FIG. 4 of the drawings taking along line X—X of FIG. 3, and the refractory metal silicide strips RS4 and RS11 are closed to the aluminum strip AL as well as to the polysilicon strip PS.

A problem is encountered in the prior art semiconductor device in that the sense amplifier circuits tend to make errors in the difference amplification. In detail, the amount of the parasitic capacitance coupled to each sense amplifier circuit is drastically decreased by virtue of the transfer gates as described hereinbefore, and the reduction of the parasitic capacitance enhances the sensitivity of the sense amplifier circuit. This means that the sense amplifier is affectable even though the amount of electric unbalance is not so much between the associated bit lines.

Then, let us consider the parasitic capacitances coupled to a pair of the nodes such as, for example, NA2 and NB2. First, parts of the parasitic capacitances coupled to the nodes NA2 and NB2 are occupied by the coupling capacitances between the gate electrodes and the source/drain regions of the transfer gates TA2 and TB2, respectively, however, these coupling capacitances are equal in value to one another, because the transfer gates TA2 and TB2 are generally identical in dimension with one another. For this reason, those coupling capacitances are less causative of the error in the difference amplification. However, since the aluminum strip AL and the branch of the polysilicon strip PS are located in the vicinity of one of the bit lines RS4 as will be seen from FIG. 4, only the node NB2 is affected by coupling capacitances CC1 and CC2, and the electric unbalance takes place between the nodes NA2 and NB2 and, accordingly, between the amounts of charges respectively driven by the amplifying transistors QSA3 and QSA4 of the sense amplifier circuit SA2. While the semiconductor memory device is small in integration density, the coupling capacitances CC1 and CC2 may not be a case, however, these coupling capacitances CC1 and CC2 become serious in a semiconductor memory device with an extremely large number of memory cells. In fact, the amount of the coupling capacitances CC1 and CC2 ranges from 4 fF to 5 fF in an ultra large scale integration, and the coupling capacitances CC1 and CC2 are causative of that undesirable noise upon descent of the transfer signal which is of the order of 20 % in terms of the small difference in voltage level due to the reading out of the data bit. The large undesirable noise tends to cause the sense amplifier circuit to make the error, and the production yield is deteriorated due to the small noise margin.

SUMMARY OF THE INVENTION

It is therefore an important object of the present invention to provide a semiconductor memory device which is free from the error in the difference amplification.

It is also an importance object of the present invention to provide a semiconductor memory device the structure of which eliminates the electric unbalance between the bit lines paired with one another.

To accomplish these objects, the present invention proposes to arrange a pair of nodes in a symmetrical affection with respect to a contact window between an upper level transfer signal line and lower level gate electrodes of a pair of transfer gates.

In accordance with one aspect of the present invention, there is provided a semiconductor memory device fabricated on a semiconductor substrate in a multiple level structure including a lower insulating film, an inter-level insulating film and an upper level insulating film, comprising: (a) a plurality of memory cells arranged in rows and columns; (b) a plurality of first bit lines each coupled to the memory cells of every second column; (c) a plurality of second bit lines respectively paired with the first bit lines for formation of a plurality of bit line pairs and respectively coupled to the memory cells of the other columns; (d) a precharging circuit operative to provide a first voltage level on all of the bit line pairs; (e) a dummy cell array coupled to the bit line pairs and operative to provide a reference voltage level on one of the first bit lines and the second bit lines; (f) a plurality of sense amplifier circuits provided in association with the bit line pairs, respectively, and operative to increase small differences in voltage level on the respective bit line pairs; (g) a plurality of first interconnections paired with a plurality of second interconnections for providing a plurality of interconnection pairs respectively coupled to the sense amplifier circuits, the first and second interconnections extending on the inter-level insulating film; and (h) a plurality of transfer gates respectively coupled between the bit line pairs and the interconnection pairs and gated by a transfer signal line so as to establish conduction paths for propagating the small differences to the sense amplifier circuits, respectively, the transfer gate line extending on the upper level insulating film, in which the transfer gates comprises respective source/drain regions formed in the semiconductor substrate and respective gate electrodes located on those areas of the lower level insulating film between the source/drain regions, respectively, wherein the transfer signal line is connected to the gate electrodes through respective contact windows each located between the first and second interconnections of each interconnection pair.

In accordance with another aspect of the present invention, there is provided a semiconductor memory device fabricated on a semiconductor substrate in a multiple level structure including a lower insulating film, an inter-level insulating film and an upper level insulating film, comprising: (a) a plurality of memory cells arranged in rows and columns; (b) a plurality of first bit lines each coupled to the memory cells of every second column; (c) a plurality of second bit lines respectively paired with the first bit lines for formation of a plurality of bit line pairs and respectively coupled to the memory cells of the other columns; (d) a precharging circuit operative to provide a first voltage level on all of the bit line pairs; (e) a dummy cell array coupled to the bit line pairs and operative to provide a reference voltage level on one of the first bit lines and the second bit lines; (f) a plurality of sense amplifier circuits provided in association with the bit line pairs, respectively, and operative to increase small differences in voltage level on the respective bit line pairs; (g) a plurality of first interconnections paired with a plurality of second interconnections for providing a plurality of interconnection pairs respectively coupled to the sense amplifier circuits, the first and second interconnections extending on the inter-level insulating film; and (h) a plurality of transfer gates respectively coupled between the bit line pairs and the interconnection pairs and gated by a transfer signal line so as to establish conduction paths for propagating the small differences to the sense amplifier circuits, respectively, the transfer gate line extending on the upper level insulating film, in which the transfer gates comprises respective source/drain regions formed in the semiconductor substrate and respective gate electrodes located on those areas of the lower level insulating film between the source/drain regions, respectively, wherein the transfer signal line is coupled to the gate electrodes through respective contact windows each located between the first bit line of one of the bit line pairs and the second bit line of another bit line pairs adjacent to aforesaid one of the bit line pairs.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

First embodiment

Figure 1:
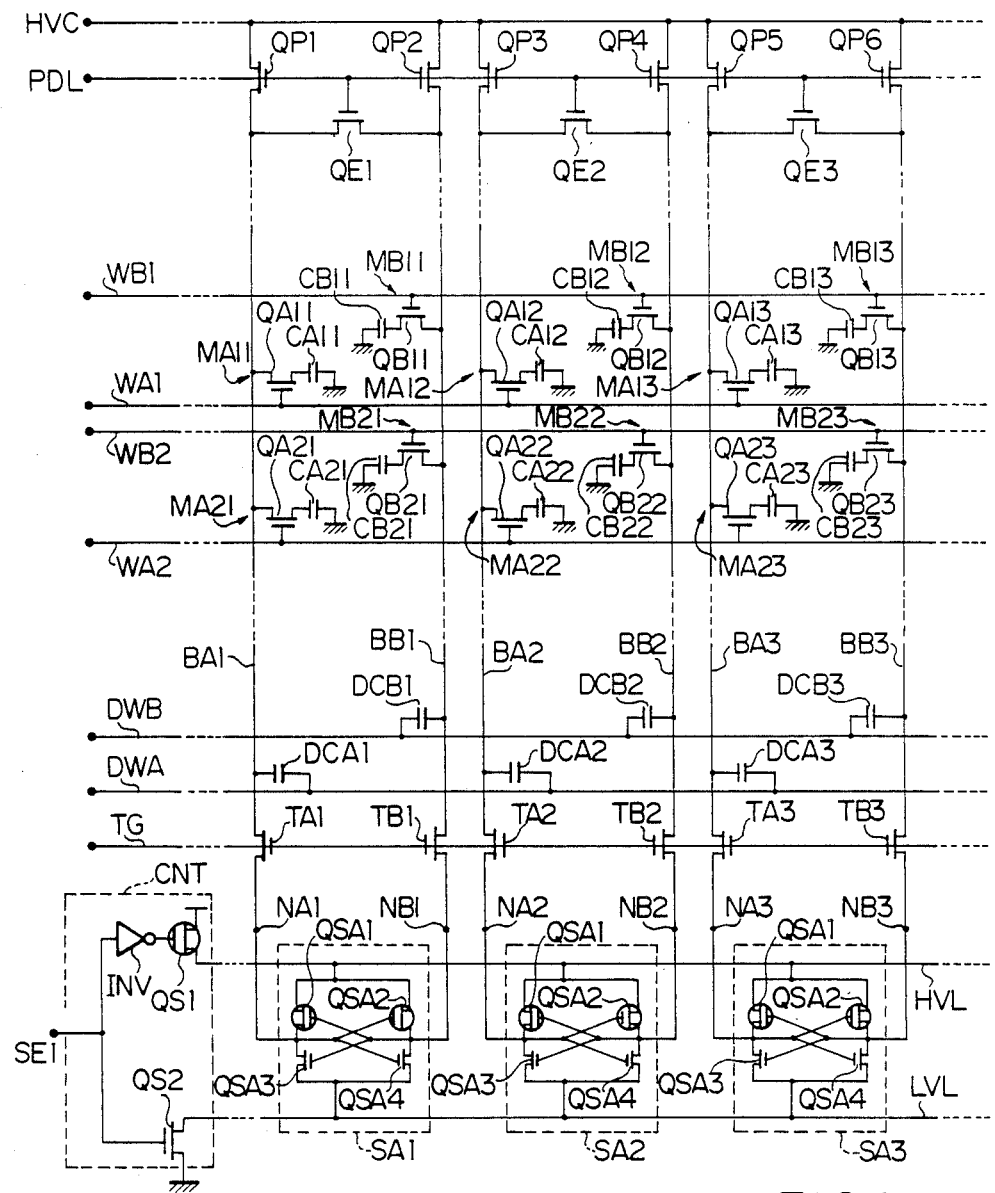
FIG. 1 is a circuit diagram showing the arrangement of a semiconductor memory device to which the present invention appertains.
Figure 2:
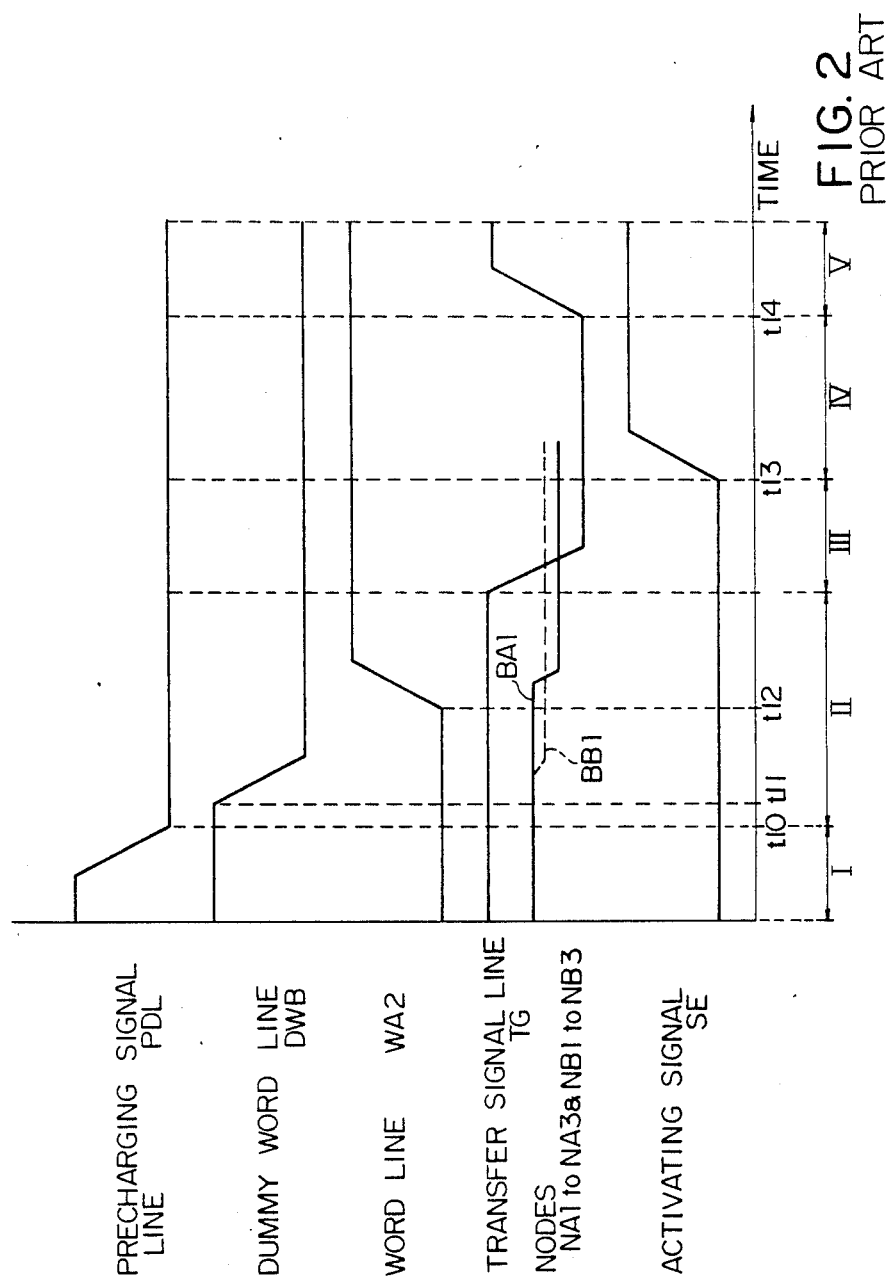
FIG. 2 is a diagram showing the waveforms of essential signals produced in the semiconductor memory device shown in FIG. 1 upon reading out a data bit from one of the memory cells.
Figure 3:
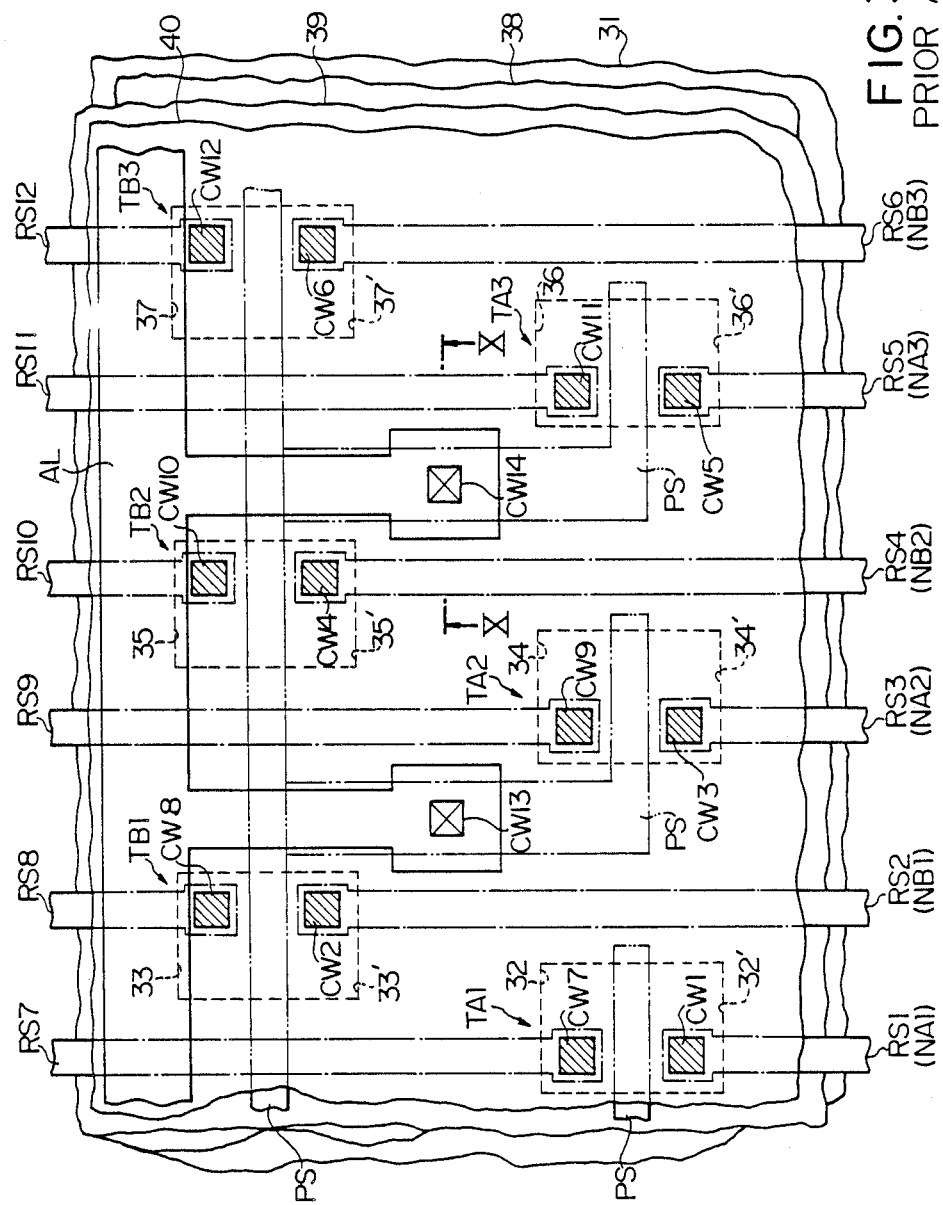
FIG. 3 is a partially stripped off plan view showing the structure of a part of the semiconductor memory device shown in FIG. 1.
Figure 4:
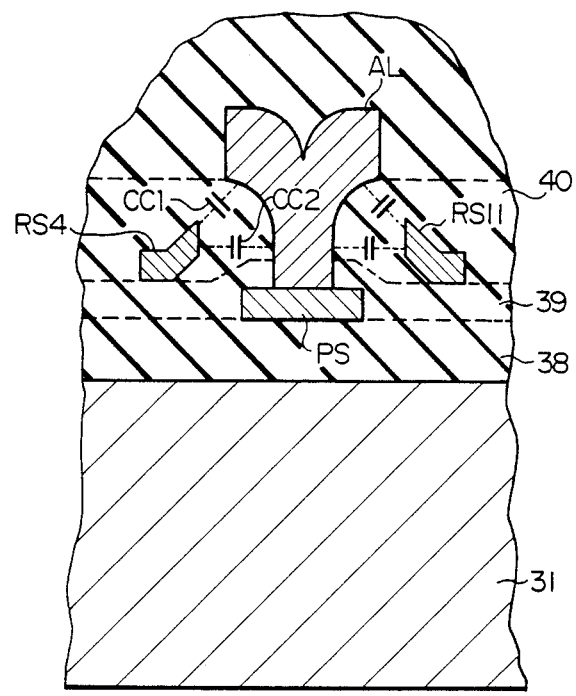
FIG. 4 is a cross sectional view taken along the line X—X of FIG. 3, and showing the three-dimensional structure of a part of the semiconductor memory device.
Figure 5:
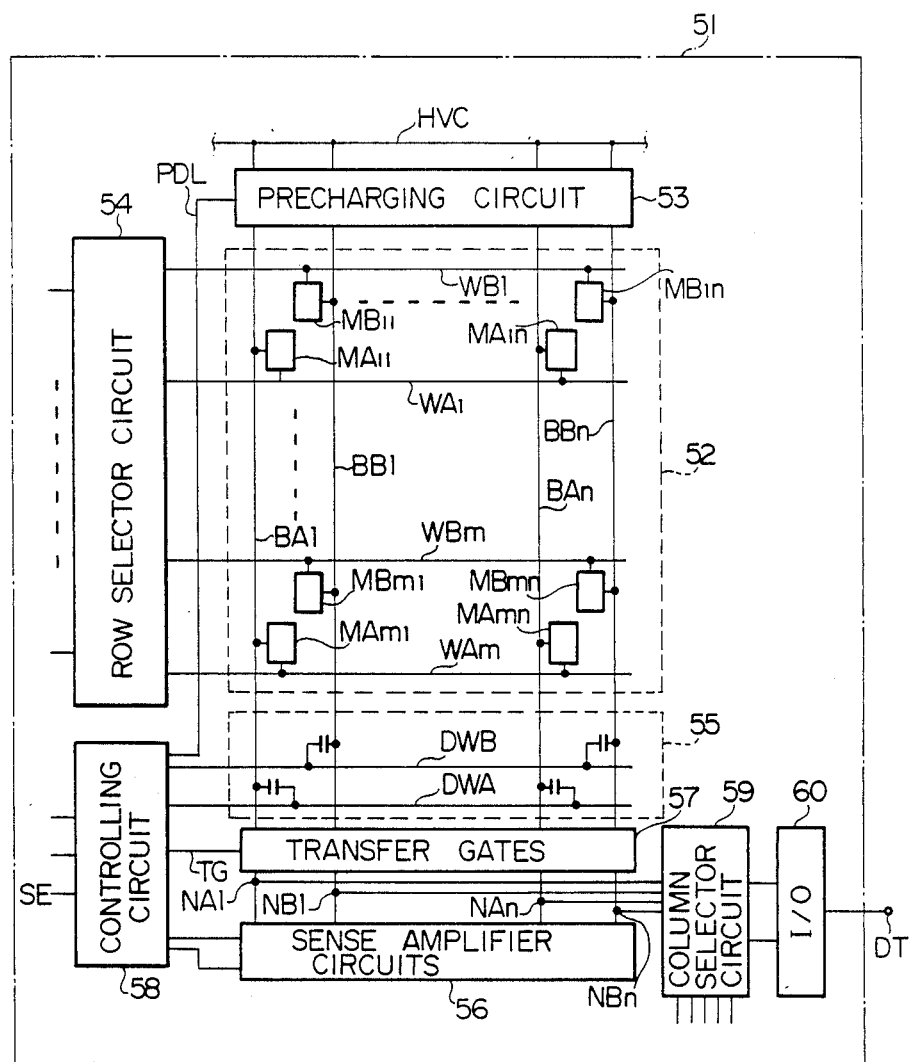
FIG. 5 is a block diagram showing the circuit arrangement of a semiconductor memory device according to the present invention.

Referring first to FIG. 5 of the drawings, an essential part of a semiconductor memory device is illustrated, and is fabricated on a semiconductor substrate 51. The semiconductor memory device comprises a memory cell array 52 associated with a plurality of word lines WA1 to WAm and WB1 to WBm and with bit lines BA1 to BAn respectively paired with bit lines BB1 to BBn, a precharging circuit responsive to a precharging signal PDL and coupled between a positive high voltage line HVC and the bit lines BA1 to BAn and BB1 to BBn, a row selector circuit 54 responsive to a row address bits and selectively driving the word lines, a dummy capacitor array 55 associated with dummy word lines DWA and DWB and coupled to the bit lines BA1 to BAn and BB1 to BBn for producing a reference voltage level on one of the bit line groups BA1 to BAn and BB1 to BBn, sense amplifier circuits 56 coupled between two voltage lines different in voltage level and increasing differences in voltage level, and transfer gates 57 responsive to a transfer signal TG for providing conduction paths between the bit lines BA1 to BAn and BB1 to BBn and the sense amplifier circuits 56. The semiconductor memory device further comprises a controlling circuit 58 which is supplied with at least an activating signal SE and produces at least the precharging signal PDL and the transfer signal TG and activates the sense amplifier circuit. The controlling circuit 58 further is operative to selectively drive the dummy word lines. Between the transfer gates 57 and the sense amplifier circuits 56 are provided nodes NA1 and NB1 to NAn to NBn which are coupled to a column selector circuit 59 responsive to column address bits for selection. The column selector circuit 59 in turn is coupled to an input/output circuit 60 associated with a data terminal DT. Although a large number of memory cells are incorporated in the memory cell array 52, however, only eight memory cells are shown in FIG. 5 and labeled with MA11, MA1n, MAm1, MAmn, MB11, MB1n, MBm1, MBmn, respectively. The component circuits are basically similar in arrangement to those shown in FIG. 1, and, moreover, the semiconductor memory device shown in FIG. 5 is similar in circuit behavior to the semiconductor memory device shown in FIG. 1, so that no detailed description is incorporated hereinbelow.

Figure 6:
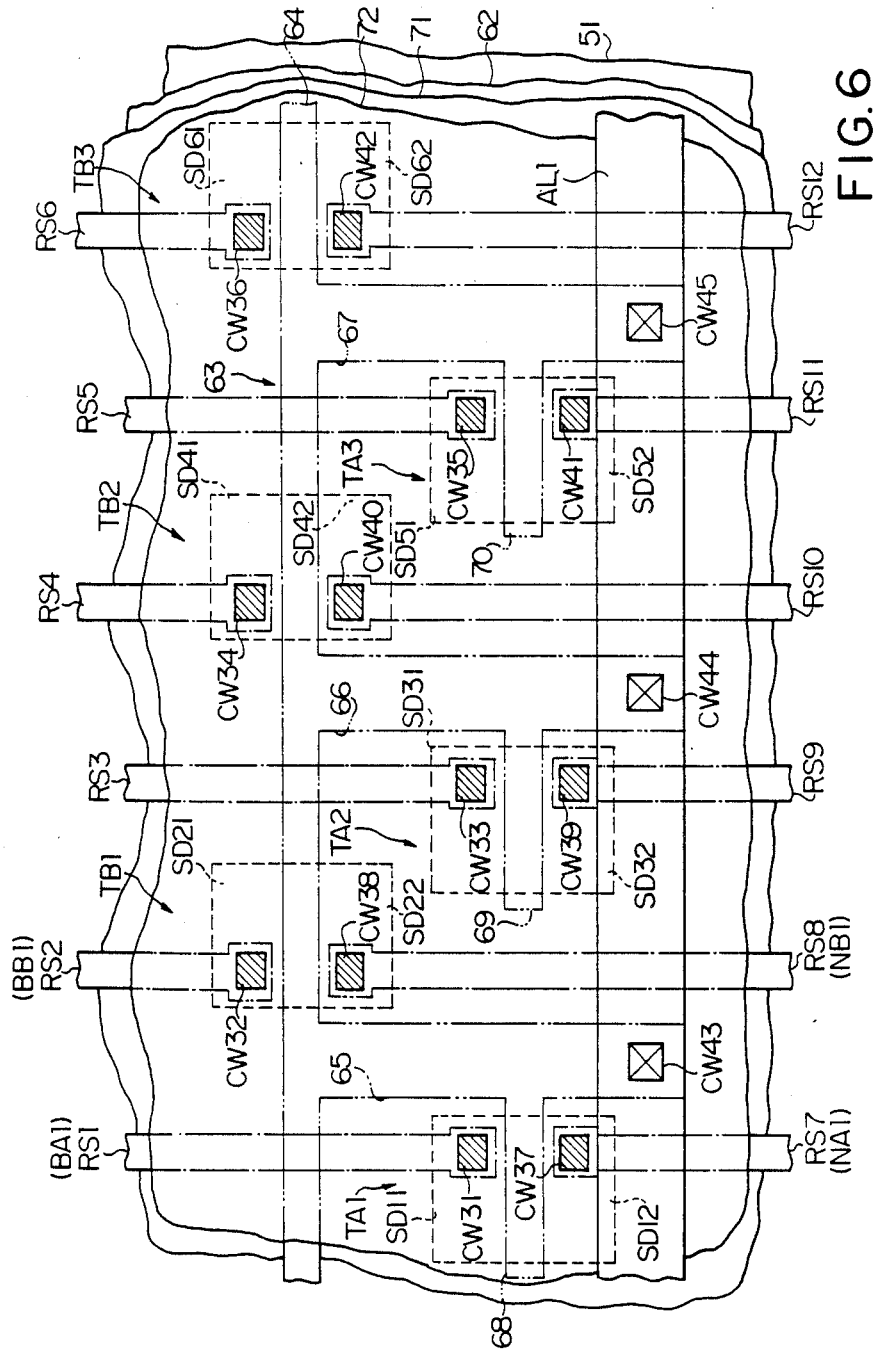
FIG. 6 is a partially stripped off plan view showing a part of the semiconductor memory device shown in FIG. 5.

Turning to FIG. 6 of the drawings, the three-dimensional structure around the transfer gates 57 is illustrated. Although the entire structure shown in FIG. 6 is covered with a passivation film, however, the passivation film is removed for better understanding the structure. A plurality of source/drain regions SD11, SD12, SD21, SD22, SD31, SD32, SD41, SD42, SD51, SD52, SD61 and SD62 are formed in the semiconductor substrate, and are overlain by a lower level insulating film 62. On the lower level insulating film 62 is formed a conductive strip 63 which has a trunk portion 64, branch portions 65, 66 and 67 perpendicularly projecting from the trunk portion 64, and protrusions 68, 69 and 70 perpendicularly projecting from the branch portions, respectively. The trunk portion 64 passes through those areas between source/drain regions SD21 and SD22, SD41 and SD42, and SD61 and SD62, and serves as gate electrodes of second transfer gates TB1, TB2 and TB3. On the other hand, the protrusions 68 to 70 are located over those areas between the source and drain regions SD11 and SD12, SD31 and SD32, and SD51 and SD 52, respectively, and provide gate electrodes of first transfer gates TA1, TA2 and TA3, respectively. As will be seen from FIG. 6, the first transfer gates TA1 to TA3 and the second transfer gates TB1 to TB3 are arranged in a staggered manner so that a relatively small amount of area on the semiconductor substrate 51 is occupied by the first and second transfer gates TA1 to TA3 and TB1 to TB3, because the bit line pairs are formed at a reduced interval.

The conductive strip 63 is covered with an inter-level insulating film 71, and a plurality of refractory metal silicide strips RS1, RS2, RS3, RS4, RS5 and RS6 are formed in parallel to one another on the inter-level insulating film 71. The refractory metal strips RS1 and RS2 are paired with each other for providing the bit line pair BA1 and BA2, and every second refractory metal silicide strip RS3 or RS5 is respectively paired with the adjacent refractory metal silicide strip RS4 or RS6 for providing another bit line pairs. In the inter-level insulating film 71 are formed contact windows CW32, CW33, CW34, CW35 and CW36 through which the refractory metal silicide strips RS1 to RS6 respectively pass so as to be throught into contact with the source/drain regions SD11, SD21, SD31, SD41, SD51 and SD61.

On the inter-level insulating film 71 are further formed refractory metal silicide strips RS7, RS8, RS9, RS10, RS11 and RS12 which are respectively confronted to the refractory metal silicide strips RS1 to RS6. Every second refractory metal silicide strip RS7, RS9 or RS11 is paired with the adjacent strip RS8, RS10 or RS12, an the refractory metal silicide strips RS7, RS9 and RS11 are referred to as first interconnections, and the silicide strips RS8, RS10 and RS12 provide second interconnections. The first interconnections are respectively paired with the second interconnections for providing interconnection pairs, and the interconnection pairs are respectively coupled between the bit line pairs and the sense amplifier circuits. In the inter-level insulating film 71 are further formed contact windows CW37, CW38, CW39, CW40, CW41 and CW42 which allow the refractory metal silicide strips RS7 to RS12 to be brou9ht into contact with the source/drain regions SD12, SD22, SD32, SD42, SD52 and SD62, respectively. Thus, the transfer gates TA1 to TA3 and TB1 to TB3 intervene between the bit line pairs and the interconnection pairs, and, for this reason, small differences in voltage level produced on the respective bit line pairs upon reading out operation are relayed to the interconnection pairs and, accordingly, to the sense amplifier circuits. The bit line pairs and the interconnection pairs have respective longitudinal directions which extend substantially in perpendicular to a direction of the staggered arrangement of the source/drain regions.

The interconnection pairs and the bit line pairs are covered with an upper level insulating film 72, and an aluminum strip AL1 is formed on the upper level insulating film 72. Contact windows CW43, CW44 and CW45 are formed in the upper level and inter-level insulating films 71 and 72, and are located between the refractory metal silicide strips RS7 and RS8 RS9 and RS10, and RS11 and RS12, respectively. The aluminum strip AL1 serves as the transfer signal line TG, and projects through the contact windows CW43, CW44 and CW45 so as to be brought into contact with the branch portions 65, 66 and 67. The aluminum strip AL1 thus coupled to the polysilicon strip 64 supplies the transfer signal to the gate electrodes of the transfer gates TA1 to TA3 and TB1 to TB3, and allows the transfer gates concurrently turn on in the presence of the transfer signal. Additionally, the contact windows in the inter-level insulating film 7 1 are hatched so as to be discriminated from the contact windows in the upper level insulating film 7 2 each marked with an X in a square.

Since each of the contact windows CW43, CW44 and CW45 is located between the first and second interconnections of each pair, a parasitic capacitance between the aluminum strip AL1 and the first interconnection is approximately equal to a parasitic capacitance between the aluminum strip AL1 and the second interconnection, and, for this reason, the associated sense amplifier circuit is equally affected by the parasitic capacitances. This means that no undesirable electrical unbalance takes place in the sense amplifier circuit, and, accordingly, the error is never made in the sense amplification. In this instance, the conductive strip 63 is formed of a polysilicon, and serves as a transfer signal line.

As will be seen from FIG. 6 of the drawings, each of the contact windows CW43, CW44 and CW45 is located at that area over the center area of each branch portion in terms of the width direction thereof. Each of the contact windows CW43, CW44 and CW45 is spaced from the edges of the refractory metal silicide strips RS7 and RS8, RS9 and RS10, or RS11 and RS12 by a predetermined distance. In other words, the silicide strips of each refractory metal silicide strip pair have respective influences of each branche substantially equal in value to each other.

Second embodiment

Figure 7:
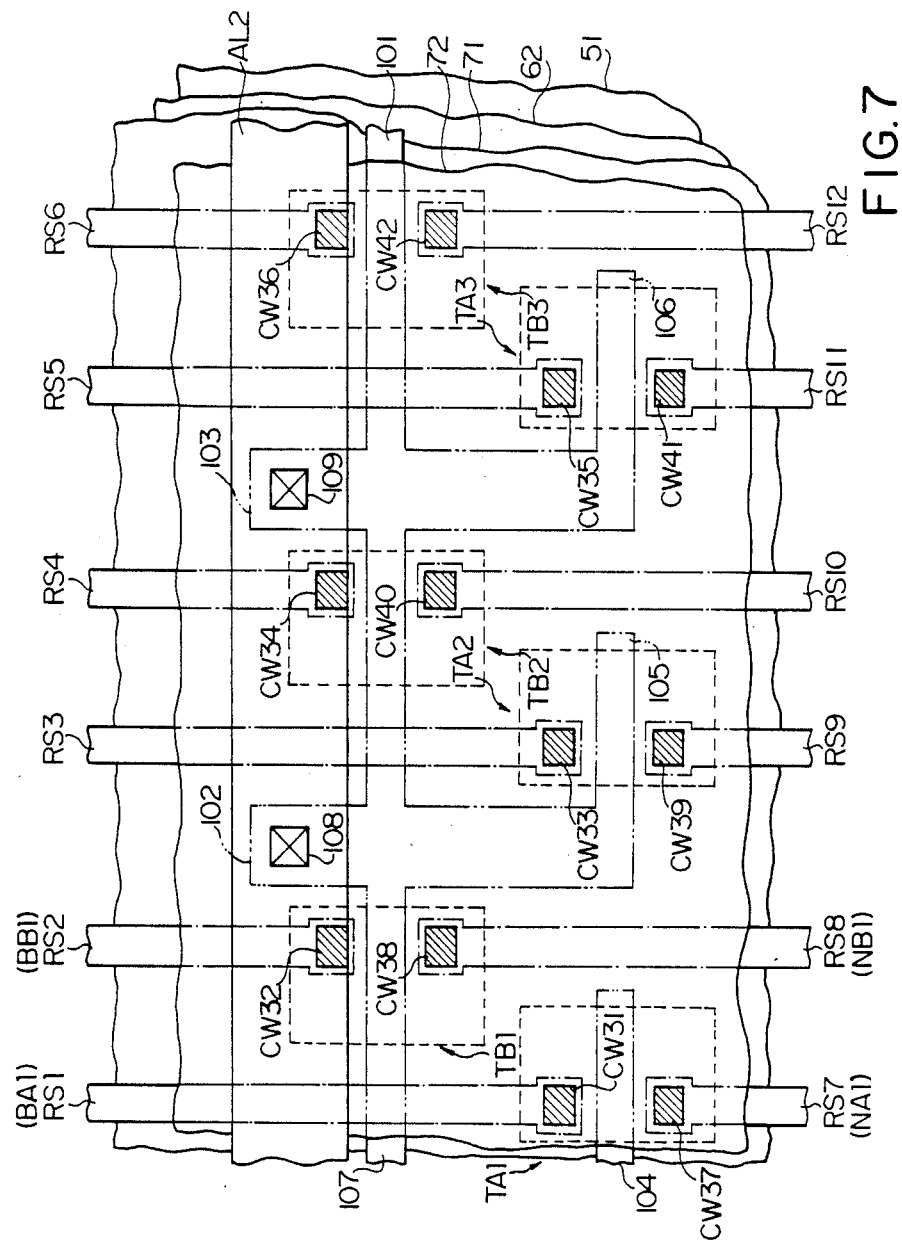
FIG. 7 is a partially stripped off plan view showing a part of another semiconductor memory device embodying the present invention

Turning to FIG. 7 of the drawings, the structure of another semiconductor memory device is partially illustrated, however, the semiconductor memory device is similar in arrangement to that shown in FIGS. 5 and 6 with the exception of the configuration of a polysilicon strip 101 and the location of an aluminum strip AL2, so that corresponding films and strips are designated by the same reference numerals used in FIG. 6 without any detailed description.

The polysilicon strip 101 has contact portions including portions 102 and 103 and extending substantially in parallel to the refractory metal silicide films RS1 to RS12. The contact portions have first protrusions 104, 105 and 106 projecting therefrom, and the first protrusions 104 to 106 are located over those areas between the source/drain regions of the first transfer gates TA1 to TA3. The contact portions 102 and 103 are bridged with a lateral strip 107 extending in perpendicular to the contact portions, and the lateral strip 107 passes over those areas between the source/drain regions of the second transfer gates TB1 to TB3.

The aluminum strip AL2 is brought into contact with the contact portions 102 and 103 through contact windows 108 and 109, and the contact windows are located between the refractory metal silicide strips RS2 and RS3 and between the refractory metal silicide strips RS4 and RS5, respectively. In this arrangement, electrical unbalances respectively take place the bit line pairs, however, the electrical unbalances are not affectable for the sense amplifier circuits, because the sense amplifier circuits are isolated from the bit line pairs and, accordingly, from the electrical unbalances by the transfer gates in the off states. Off course, when the transfer gates turn on, the sense amplifier circuits are conducted to the bit line pairs. Thus, the semiconductor memory device shown in FIG. 7 is free from the electrical unbalances, and, accordingly, achieves a high speed operation without any error in the difference amplifications.

Although particular embodiments of the present invention have been shown and described, it will be obvious to those skilled in the art that various changes and modifications may be made without departing from the spirit and scope of the present invention. For example, the memory cells may not be of the one-transistor and one-capacitor type, and the various transfer transistors may be used between the bit line pairs and the interconnection pairs.

What is claimed is:

1. A semiconductor memory device fabricated on a semiconductor substrate in a multiple level structure including a lower insulating film, an inter-level insulating film and an upper level insulating film, comprising:
    (a) a plurality of memory cells arranged in rows and columns;
    (b) a plurality of first bit lines each coupled to the memory cells of every second column;
    (c) a plurality of second bit lines respectively paired with said first bit lines for formation of a plurality of bit line pairs and respectively coupled to the memory cells of the other columns;
    (d) a precharging circuit operative to provide a first voltage level on all of the bit line pairs;
    (e) a dummy cell array coupled to said bit line pairs and operative to provide a reference voltage level on one of said first bit lines and said second bit lines;
    (f) a plurality of sense amplifier circuits provided in association with said bit line pairs, respectively, and operative to increase small differences in voltage level on the respective bit line pairs;
    (g) a plurality of first interconnections paired with a plurality of second interconnections for providing a plurality of interconnection pairs respectively coupled to said sense amplifier circuits, said first and second interconnections extending on said inter-level insulating film; and (h) a plurality of transfer gates respectively coupled between said bit line pairs and said interconnection pairs and gated by a transfer signal line so as to establish conduction paths for propagating said small differences to the sense amplifier circuits, respectively, said transfer gate line extending on said upper level insulating film, in which said transfer gates comprises respective source/drain regions formed in said semiconductor substrate and respective gate electrodes located on those areas of said lower level insulating film between the source/drain regions, respectively, wherein said transfer signal line is coupled to said gate electrodes through respective contact windows each located between the first and second interconnections of each interconnection pair.

2. A semiconductor memory device as set forth in claim 1, in which said transfer gates are divided into first transfer gates and second transfer gates respectively coupled to said first bit lines and said second bit lines, and in which said first and second transfer gates are arranged in a staggered manner in a first direction substantially perpendicular to longitudinal directions of said interconnection pairs.

3. A semiconductor memory device as set forth in claim 2, in which the gate electrodes of said transfer gates are formed by a single conduction strip having a trunk portion extending in a second direction substantially in parallel to said first direction and located over those areas between the source/drain regions of said second transfer gates, a plurality of branch portions perpendicularly projecting from the trunk portion, and a plurality of protrusions perpendicularly projecting from the branch portions, respectively, and located over those areas between said source/drain regions of said first transfer gates, respectively.

4. A semiconductor memory device as set forth in claim 3, in which said transfer signal line and said conduction strip are respectively formed of an aluminum and a polysilicon, and in which said bit line pairs and said interconnection pairs are formed of a refractory metal silicide 5. A semiconductor memory device as set forth in claim 3, in which said transfer signal line and said conduction strip are respectively formed of an aluminum and a polysilicon, and in which said bit line pairs and said interconnection pairs are formed of a refractory metal silicide 6. A semiconductor memory device fabricated on a semiconductor substrate in a multiple level structure including a lower insulating film, an inter-level insulating film and an upper level insulating film, comprising:

(a) a plurality of memory cells arranged in rows and columns;

(b) a plurality of first bit lines each coupled to the memory cells of every second column;

(c) a plurality of second bit lines respectively paired with said first bit lines for formation of a plurality of bit line pairs and respectively coupled to the memory cells of the other columns;

(d) a precharging circuit operative to provide a first voltage level on all of the bit line pairs;

(e) a dummy cell array coupled to said bit line pairs and operative to provide a reference voltage level on one of said first bit lines and said second bit lines;

(f) a plurality of sense amplifier circuits provided in association with said bit line pairs, respectively, and operative to increase small differences in voltage level on the respective bit line pairs;

(g) a plurality of first interconnections paired with a plurality of second interconnections for providing a plurality of interconnection pairs respectively coupled to said sense amplifier circuits, said first and second interconnections extending on said inter-level insulating film; and (h) a plurality of transfer gates respectively coupled between said bit line pairs and said interconnection pairs and gated by a transfer signal line so as to establish conduction paths for propagating said small differences to the sense amplifier circuits, respectively, said transfer gate line extending on said upper level insulating film, in which said transfer gates comprises respective source/drain regions formed in said semiconductor substrate and respective gate electrodes located on those areas of said lower level insulating film between the source/drain regions, respectively, wherein said transfer signal line is connected to said gate electrodes through respective contact windows each located between the first bit line of one of said bit line pairs and the second bit line of another bit line pairs adjacent to said one of the bit line pairs.

7. A semiconductor memory device as set forth in claim 6, in which said transfer gates are divided into first transfer gates and second transfer gates respectively coupled to said first bit lines and said second bit lines, and in which said first and second transfer gates are arranged in a staggered manner in a first direction substantially perpendicular to longitudinal directions of said interconnection pairs.

8. A semiconductor memory device as set forth in claim 7, in which the gate electrodes of said transfer gates are formed by a single conduction strip having a plurality of contact portions each located between said bit line pairs adjacent to one another and extending substantially in parallel to the longitudinal directions of said interconnections, first protrusions perpendicularly projecting from the contact portions and located over those areas between the source/drain regions of said first transfer gates, respectively, and a lateral portion perpendicularly bridging the contact portions and located over those areas between the source/drain regions of said second transfer gates, respectively.

* * * * *

UNITED STATES PATENT AND TRADEMARK OFFICE
CERTIFICATE OF CORRECTION

PATENT NO. : 4,984,197

DATED : January 8, 1991

INVENTOR(S) : Takako Sakagami

It is certified that error appears in the above-identified patent and that said Letters Patent is hereby corrected as shown below:

Column 2, line 15, delete "tc" and insert --to--;

Column 2, line 23, delete "filed" and insert --field--;

Column 2, line 32, delete "filed" and insert --field--;

Column 4, line 41, delete "fromed" and insert --formed--;

Column 9, line 3, delete "brou9ht" and insert --brought--;

Column 9, line 33, delete "7 1" and insert --71--;

Column 9, line 35, delete "7 2" and insert --72--;

UNITED STATES PATENT AND TRADEMARK OFFICE
CERTIFICATE OF CORRECTION

PATENT NO. : 4,984,197

DATED : January 8, 1991

INVENTOR(S) : Takako Sakagami

It is certified that error appears in the above-identified patent and that said Letters Patent is hereby corrected as shown below:

Column 9, line 59, delete "branche" and insert --branch--;

Column 10, line 27, delete "Off" and insert --of--;

Column 11, line 47, delete "3" and insert --8--.

Signed and Sealed this

Fifth Day of October, 1993

Attest:

BRUCE LEHMAN

Attesting Officer

Commissioner of Patents and Trademarks